US010727208B2

(12) United States Patent
Ding et al.

(10) Patent No.: US 10,727,208 B2
(45) Date of Patent: Jul. 28, 2020

(54) PREPACKAGED STAIR-STACKED MEMORY MODULE IN A CHIP SCALE SYSTEM IN PACKAGE, AND METHODS OF MAKING SAME

(71) Applicant: Intel Corporation, Santa Clara, CA (US)

(72) Inventors: Zhicheng Ding, Shanghai (CN); Bin Liu, Shanghai (CN); Yong She, Songjiang (CN); Aiping Tan, Shanghai (CN); Li Deng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/326,343

(22) PCT Filed: Sep. 29, 2016

(86) PCT No.: PCT/CN2016/100760
§ 371 (c)(1),
(2) Date: Feb. 18, 2019

(87) PCT Pub. No.: WO2018/058416
PCT Pub. Date: Apr. 5, 2018

(65) Prior Publication Data
US 2019/0229092 A1    Jul. 25, 2019

(51) Int. Cl.
*H01L 25/065* (2006.01)
*H01L 25/18* (2006.01)
(Continued)

(52) U.S. Cl.
CPC ...... *H01L 25/0657* (2013.01); *G01R 31/2896* (2013.01); *H01L 22/12* (2013.01);
(Continued)

(58) Field of Classification Search
CPC ..... H01L 25/0657; H01L 25/50; H01L 25/18; H01L 22/12; H01L 2225/06506;
(Continued)

(56) References Cited

U.S. PATENT DOCUMENTS

2003/0032218 A1    2/2003    Kado et al.
2011/0210432 A1    9/2011    Goto
(Continued)

FOREIGN PATENT DOCUMENTS

JP    2014183085 A    9/2014
WO    WO-2018058416 A1    4/2018

OTHER PUBLICATIONS

"International Application Serial No. PCT/CN2016/100760, International Search Report dated Jun. 29, 2017", 4 pgs.
(Continued)

*Primary Examiner* — Kyoung Lee
(74) *Attorney, Agent, or Firm* — Schwegman Lundberg & Woessner, P.A.

(57) ABSTRACT

A pre-packaged stair-stacked memory module is mounted on a board with at least one additional component. A stair-stacked memory module includes a plurality of memory dice that are stacked vertically with respect to a processor die. A spacer is used adjacent to the processor die to create a bridge for the stair-stacked memory module. Each memory die in the stair-stacked memory module includes a vertical bond wire that emerges from a matrix for connection. The matrix encloses the stair-stacked memory module and at least a portion of the processor die. The matrix might also enclose the at least one additional component.

25 Claims, 7 Drawing Sheets

(51) Int. Cl.
*G01R 31/28* (2006.01)
*H01L 21/66* (2006.01)
*H01L 25/00* (2006.01)

(52) U.S. Cl.
CPC .............. *H01L 25/18* (2013.01); *H01L 25/50* (2013.01); *H01L 2225/0651* (2013.01); *H01L 2225/06506* (2013.01); *H01L 2225/06517* (2013.01); *H01L 2225/06562* (2013.01); *H01L 2225/06582* (2013.01); *H01L 2225/06596* (2013.01)

(58) Field of Classification Search
CPC . H01L 2225/06596; H01L 2225/06582; H01L 2225/06517; H01L 2225/0651; H01L 2225/06562; H01L 2224/05554; H01L 2224/06135; H01L 2924/1903; H01L 2924/19042; H01L 2924/1434; H01L 2224/1134; H01L 2924/18161; H01L 2924/19105; H01L 2224/73253; H01L 24/16; H01L 24/92; H01L 24/13; H01L 24/85; H01L 24/11; H01L 2224/81801; H01L 2224/13101; H01L 24/45; H01L 2224/13655; H01L 2224/13147; H01L 2224/85947; H01L 2224/85001; H01L 2924/19041; H01L 2924/19043; H01L 2224/45147; H01L 2224/73203; H01L 2924/181; H01L 2224/16225; H01L 2224/32145; H01L 24/81; G01R 31/2896
See application file for complete search history.

(56) References Cited

U.S. PATENT DOCUMENTS

| | | |
|---|---|---|
| 2011/0316072 A1 | 12/2011 | Lee |
| 2015/0108657 A1 | 4/2015 | Kim |
| 2015/0311185 A1* | 10/2015 | Ng .................... H01L 25/50 257/784 |
| 2016/0163609 A1 | 6/2016 | Rahman et al. |

OTHER PUBLICATIONS

"International Application Serial No. PCT/CN2015/100760, Written Opinion dated Jun. 29, 2017", 4 pgs.

* cited by examiner

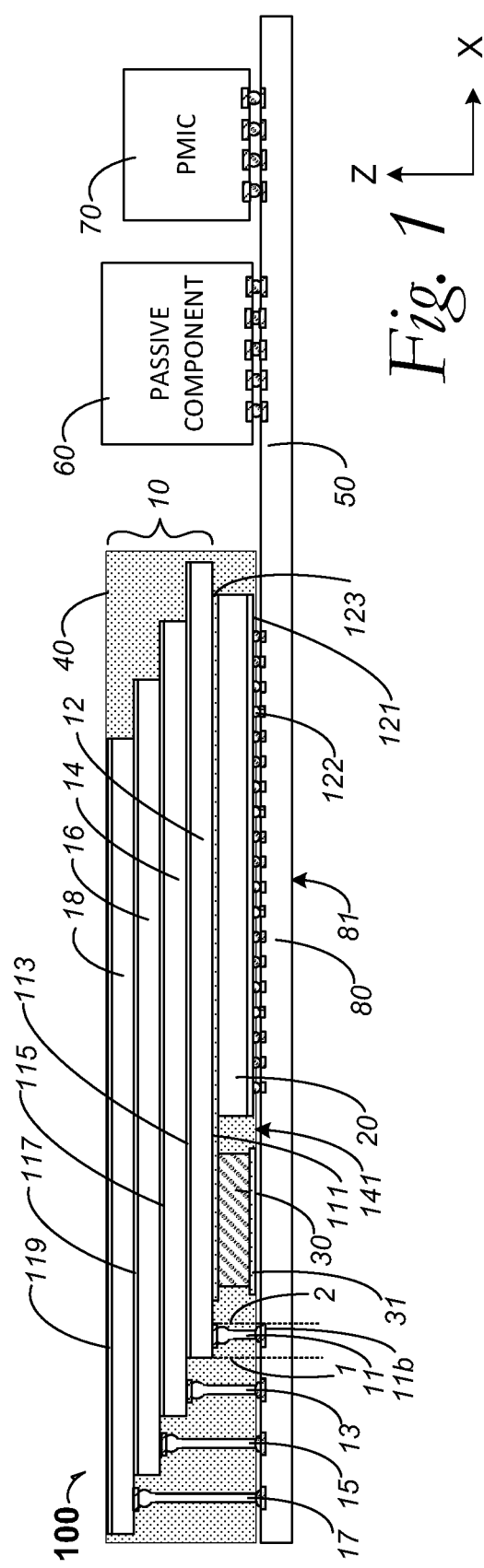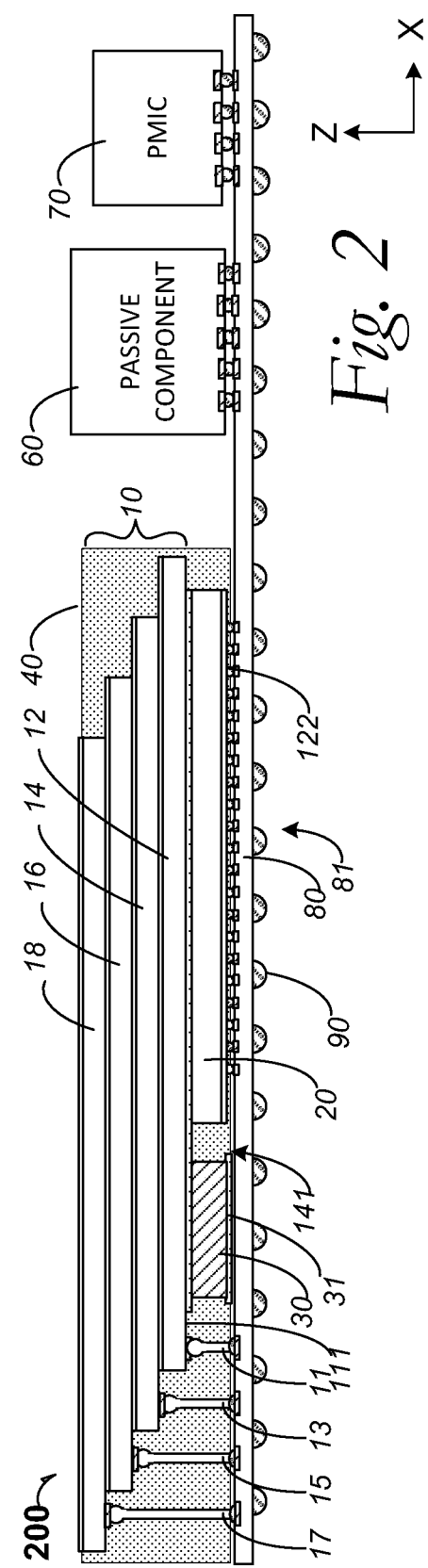

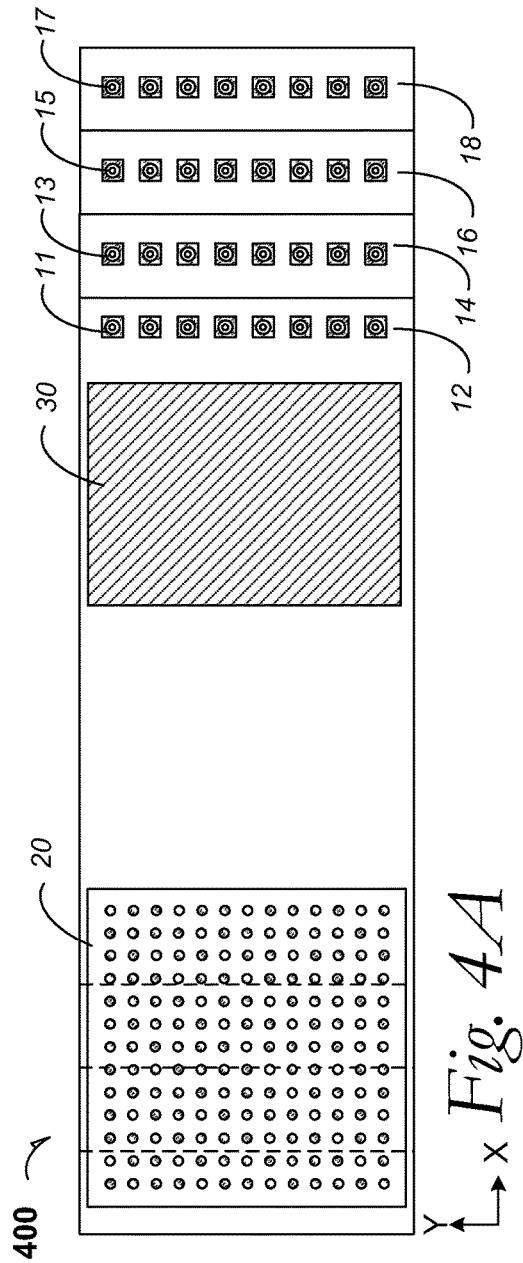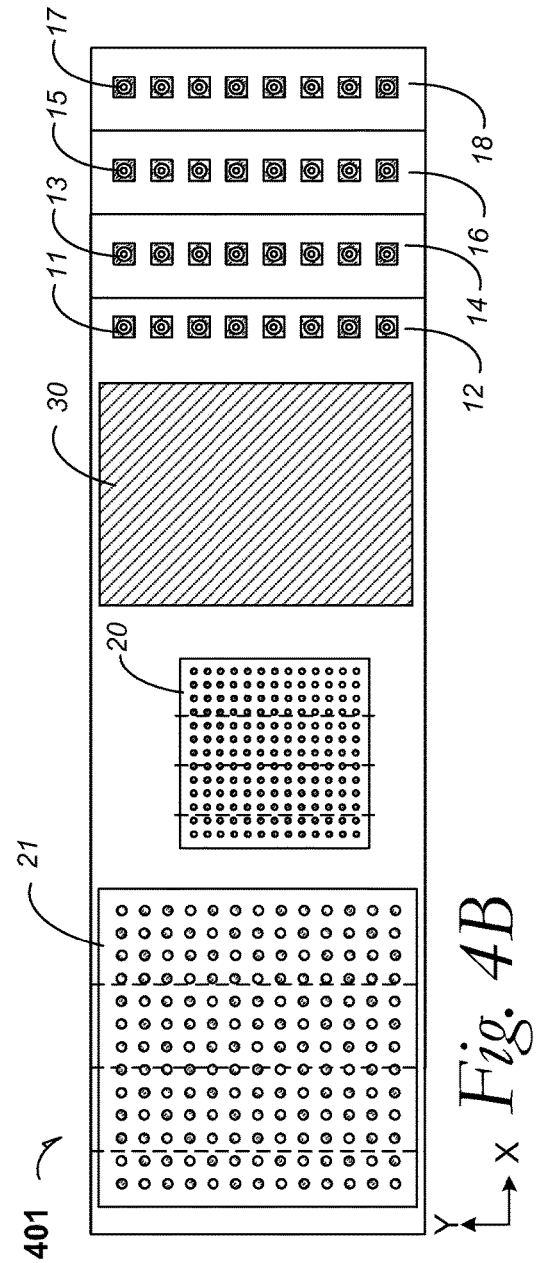

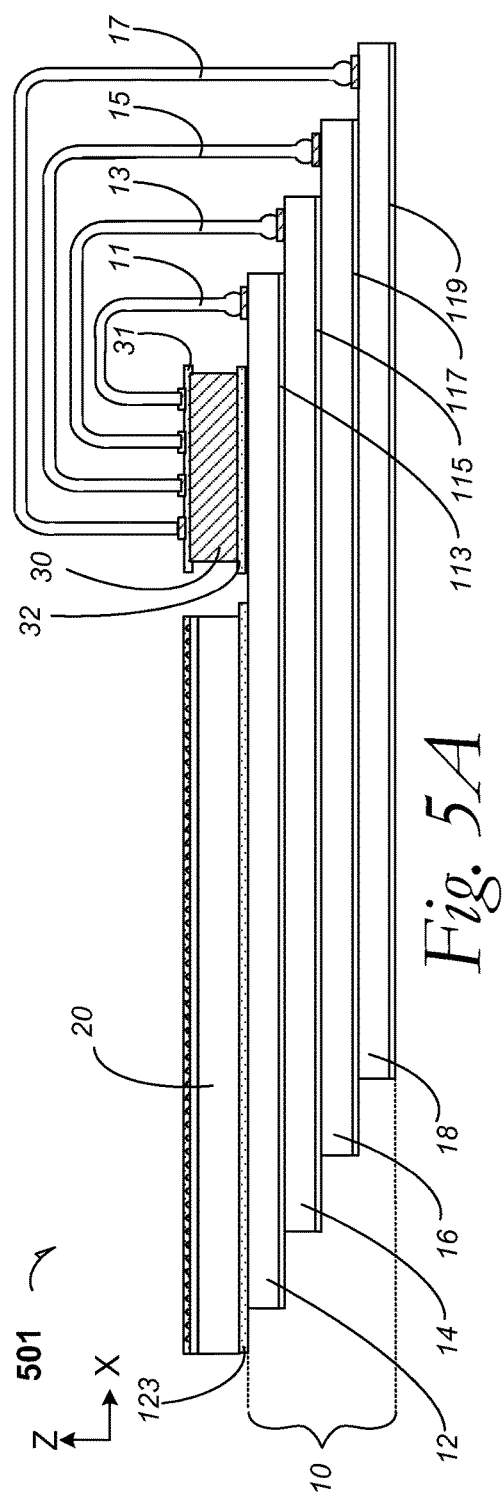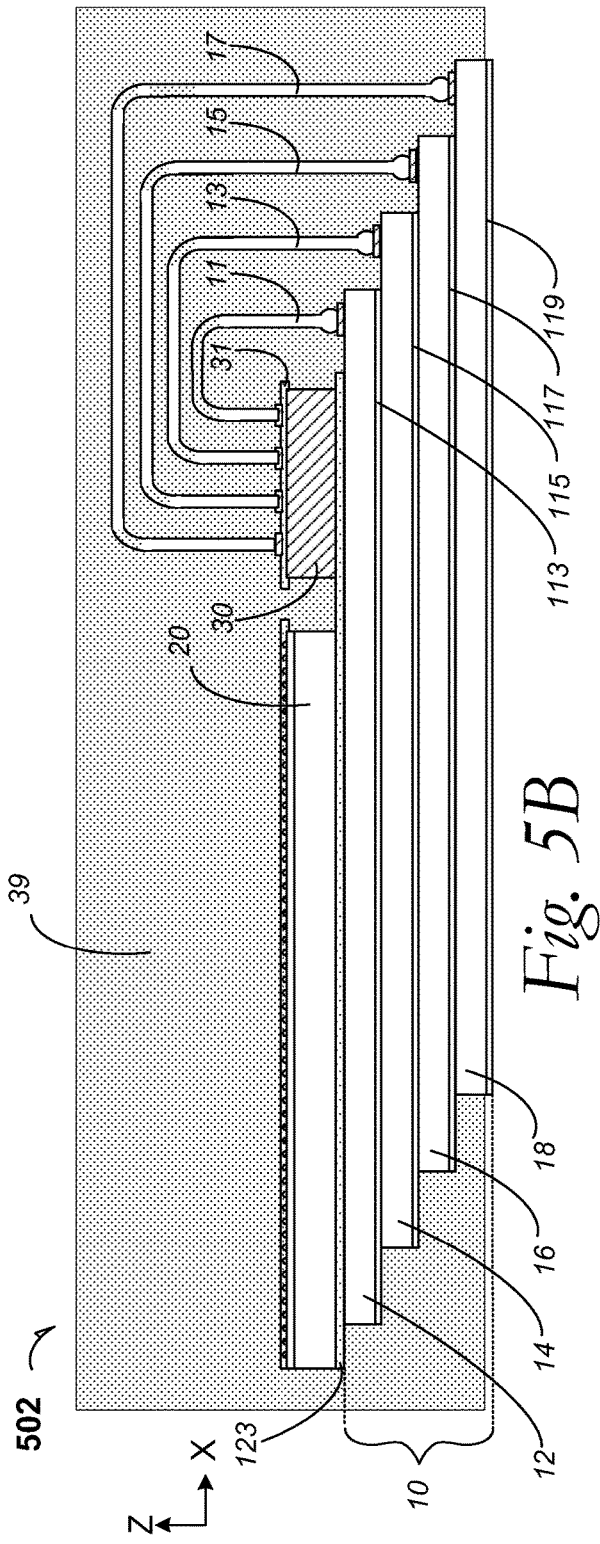

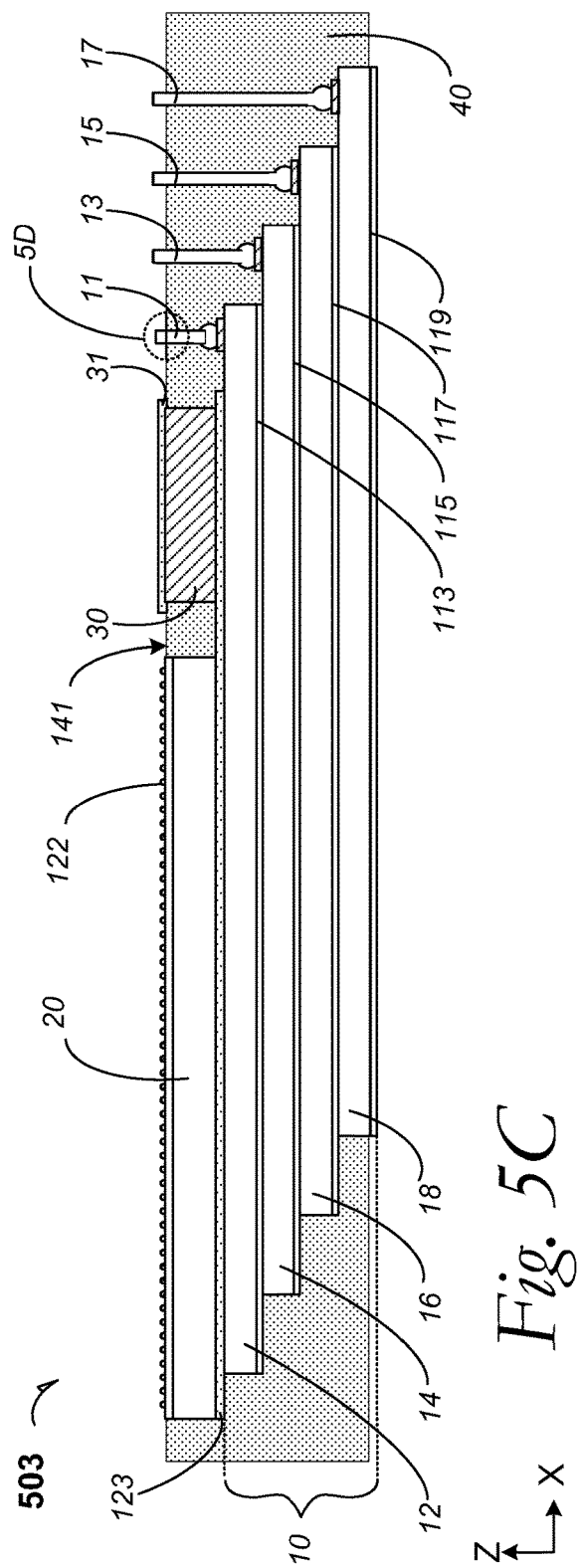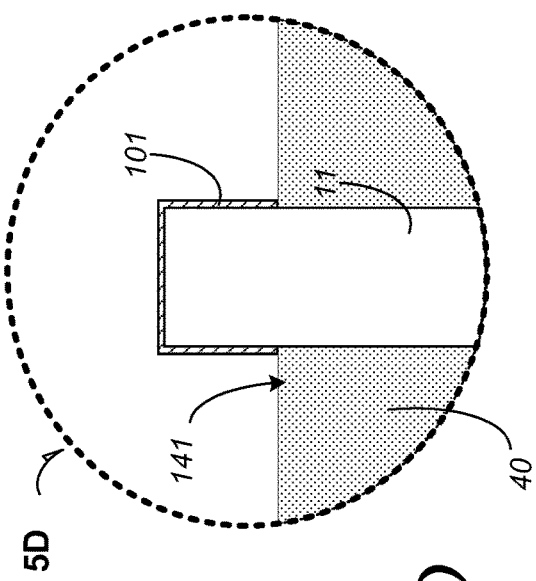
Fig. 5C
Fig. 5D

US 10,727,208 B2

PREPACKAGED STAIR-STACKED MEMORY MODULE IN A CHIP SCALE SYSTEM IN PACKAGE, AND METHODS OF MAKING SAME

CLAIM OF PRIORITY

This patent application is a U.S. National Stage Application under 35 U.S.C. 371 from international Application No. PCT/CN2016/100760, filed Sep. 29, 2016, published as WO2018/058416, which is incorporated herein by reference.

FIELD

This disclosure relates to chip-scale packaging (CSP) of systems-in-package (SiP) devices including processing, memory, and board-mounted components.

BACKGROUND

Computing devices such as mobile telephones, smart phones and tablet computers are restricted in available space because there are size limitations dictated by intended use. Size reduction presents challenges for packaging.

BRIEF DESCRIPTION OF THE DRAWINGS

Various disclosed embodiments of are illustrated by way of example, and not by way of limitation, in the figures of the accompanying drawings and in which:

FIG. 1 is a cross-section elevation of pre-packaged stair-stacked memory module that is directly mounted on a package substrate along with at least one additional component according to an embodiment;

FIG. 2 is a cross-section elevation of pre-packaged stair-stacked memory module that is mounted on a redistribution layer along with at least one additional component according to an embodiment;

FIG. 4A is a top plan of a portion of the prepackaged stair-stacked memory module according to an embodiment;

FIG. 4B is a top plan of a portion of a prepackaged stair-stacked memory module according to an embodiment;

FIG. 5A is a cross-section elevation illustrating the assembly of a processor first die to a stair-stacked memory module chip package according to a method embodiment;

FIG. 5B is a cross-section elevation of the stair-stacked memory module chip-scale package depicted in FIG. 5A after further processing according to an embodiment;

FIG. 5C is a cross-section elevation of the stair-stacked memory module chip-scale package depicted in FIG. 5B after further processing according to an embodiment;

FIG. 5D is a detail section taken from the section circle 5D in FIG. 5C;

DETAILED DESCRIPTION

Figure 3:
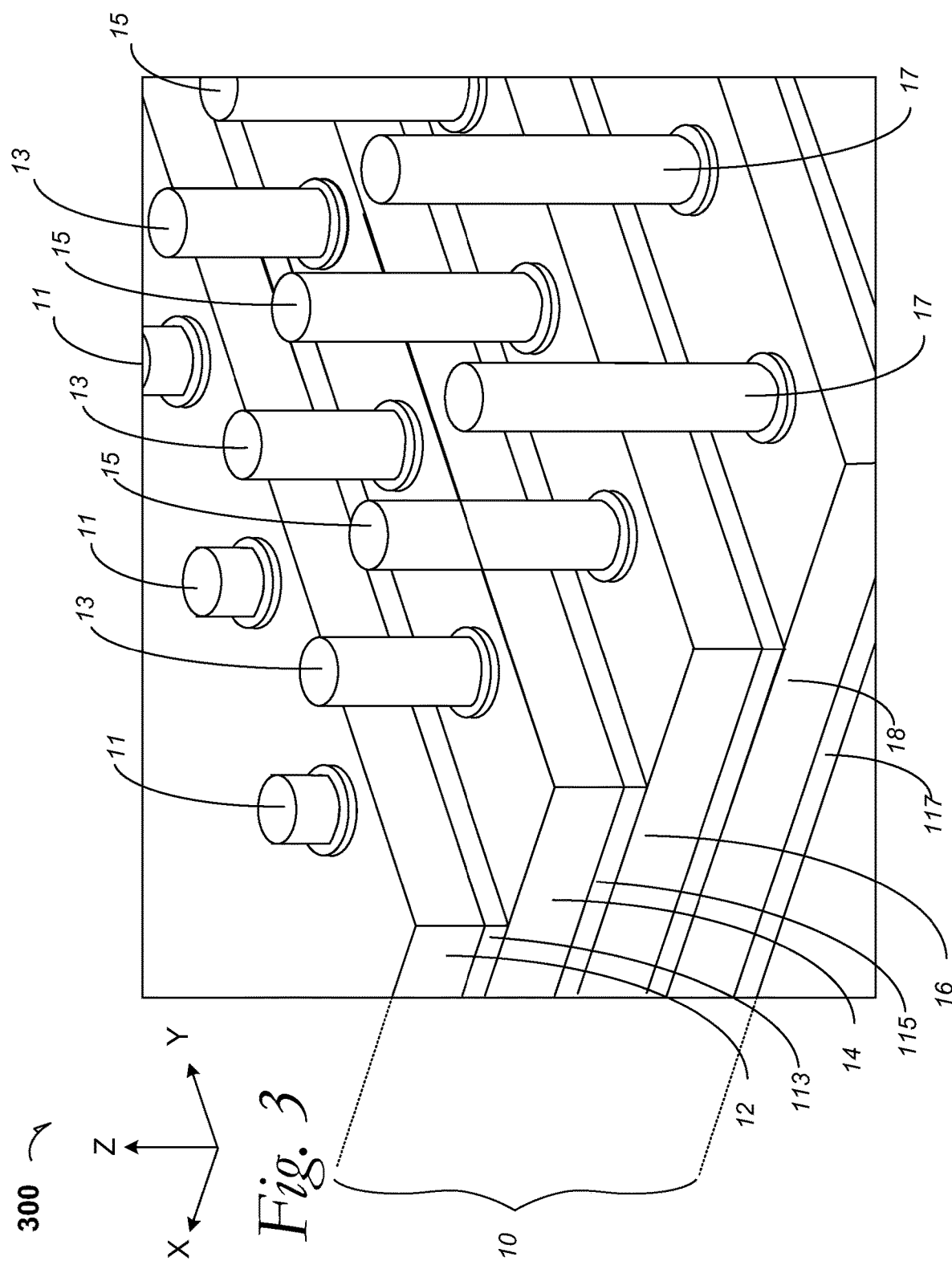
FIG. 3 is a perspective elevation detail of a portion of a stair-stacked memory module according to an embodiment.

FIG. 1 is a cross-section elevation of pre-packaged stair-stacked memory module (PPSSMM) 100 that is directly mounted on a package substrate 50 along with at least one additional component 60 and 70 according to an embodiment.

A memory first die 12 includes an active surface 111 and a backside surface (not indicated) that is covered with an adhesive first film 113. The memory first die 12 is fixed in a matrix 40 such as a molding material, and a first die vertical wire 11 contacts the active surface 111 and protrudes through the matrix 40 at a landing surface 141. In an embodiment, the first die vertical wire 11 has been thermo-compression bonded (TCB) onto the package substrate at a vertical-wire bond pad 11b.

The first die vertical wire 11 extends orthogonal from the active surface 111 of the memory first die 12. By "orthogonal" it is meant the wire 11 visually appears to be extending uniformly and directly away at a substantial right angle from the active surface 111 of the memory first die 12 to the terminal end of the wire 11. In any event, "orthogonal" may be quantified by observing the terminal end of the wire 11 protrudes from the landing surface 141 of the matrix 40, and the protruding end of the wire 11 has not deflected within the matrix 40 to either side in the X-direction more than the stair edge 1 of the memory first die 12. In an embodiment, "orthogonal" is quantified by observing the protruding end of the wire 11 has not deflected within the matrix 40 to either side in the X-direction more than the bond pad edge 2 to which the vertical bond wire 11 is bonded.

The matrix 40 may also be referred to as a package material 40. The matrix 40 may also be referred to as an encapsulation molding compound (EMC) 40 according to an embodiment. Hereinafter, the memory first die 12 and up to the memory subsequent die 18, along with the processor first die 20 may be referred to as devices in the matrix.

In an embodiment, at least one component 60 is placed upon the package substrate 50. In an embodiment, a first component 60 is a passive device such as an inductor. In an embodiment, a first component 60 is a passive device such as a capacitor. In an embodiment, a first component 60 is a passive device such as a resistor. In an embodiment, a first component 60 is a passive device such as a balun for a baseband processor. In an embodiment a power-management integrated circuit (PMIC) component 70 is placed upon the package substrate 50. The PMIC may be used such as where the memory first die 12 is part of an PPSSMM 100 that contains a solid-state drive (SSD) such as a not-AND (NAND) memory device. Consequently, the PPSSMM 100 includes a PMIC 70 that assists to control an SSD of which the memory first die 12 is a part.

In an embodiment, the package substrate 50 has a uniform bond-pad pitch that mates to the vertical bond wires 11, 13, 15 and 17, the bump array 122, and to each of the passive component 60 and the PMIC 70. In an embodiment, the bond-pad pitch is uniform for the bump array 122, and for each of the passive component 60 and the PMIC 70, but has a different bond-pad pitch exists for the vertical bond wires 11, 13, 15 and 17. In an embodiment, the bond-pad pitch is the same for the two components 60 and 70, the bond-pad pitch for the bump array 122 is different, and the bond-pad pitch for the vertical bond wires 11, 13, 15 and 17 is different from all others. In an embodiment, the package substrate 50 is configured for a unique bond-pad pitch for each device attached thereto including a different bond-pad pitch for the vertical bond wires 11, 13, 15 and 17 and the bump array 122.

It may now be appreciated there is an embodiment where the bond pad array has a first bond-pad pitch to match the processor bump array 122, vertical bond-wire bond pads have a second bond-pad pitch to match the vertical bond wires 11 up to at least 17, and the first bond-pad pitch is quantitatively different from the second bond-pad pitch. By "quantitatively different" it is meant in an embodiment, the first pitch is smaller than the second pitch.

It may now be appreciated there is an embodiment where the processor bump array 122 mates to a first bond-pad array with a first bond-pad pitch, the vertical bond-wires 11 up to at least 17 mate to a second bond-pad pitch, at least one component 60 has a third bond-pad pitch to match the connections thereon, and at least one component 70 has a fourth bond-pad pitch to match connections thereon. Accordingly in an embodiment, the first bond-pad pitch is quantitatively different from the second bond-pad pitch, the third bond-pad pitch is quantitatively different from the first- and second bond-pad pitches, and the fourth bond-pad pitch is quantitatively different from the first-second, and third bond-pad pitches. By "quantitatively different" it is meant in an embodiment that no given bond-pad pitch matches any other bond-pad pitch.

In an embodiment, the PPSSMM 100 includes the memory first die 12 (which is part of a stair-stacked memory module 10) which is stacked against a processor first die 20 at the active surface 111 by an adhesive processor-die film 123. The stair-stacked memory module 10 is seated in the matrix 40, but processing may result in a molding compound being flowed over and around the stair-stacked memory module 10 such that it may also be termed affixed in the matrix 40.

In an embodiment, the processor first die 20 is a processor die such as that made by Intel Corporation of Santa Clara, Calif. The processor first die 20 includes an active surface 121 and a backside surface that is covered by the adhesive processor-die film 123. The processor first die 20 is also seated in the matrix, but processing may result in a molding compound being flowed over and around the processor first die 20 such that it may also be termed affixed in the matrix 40. In an embodiment, the processor first die 20 is an application-specific integrated circuit (ASIC) such as a memory controller.

In an embodiment, the stair-stacked memory module 10 includes four stacked memory dice in a stair-step relationship, including the memory first die 12, a memory second die 14, a memory third die 16, and a memory fourth die 18. Where the memory second die 14 is the last die in the stair-stacked memory module 10, it may also be referred to as a memory subsequent die 14. Similarly, where the memory third die 16 is the last die in the stair-stacked memory module 10, it may also be referred to as a memory subsequent die 16. By the same token, where the memory fourth die 18 is the last die in the stair-stacked memory module 10, it may also be referred to as a memory subsequent die 18. Hereinafter, description of the PPSSMM 100 depicted in FIG. 1 will refer to the memory first-second-third- and subsequent dice 12, 14, 16 and 18, respectively. It may now be understood that more than four stair-stacked memory dice may be used.

In an embodiment, the processor first die 20 is configured adjacent a spacer 30, which has a similar vertical dimension, under package-assembly conditions, to the processor first die 20. Adjustment of the vertical height of the spacer 30 may be made by a spacer adjustor 31 such as an adhesive. The processor first die 20 and the spacer 30 are also seated in the matrix 40.

The memory first die 12 is stacked between the processor first die 20 and the other memory dice 14, 16 and 18 in the stair-stacked memory module 10. After positioning of the memory first die 12, each following memory die 14, 16 and 18 are both stacked vertically with respect to the processor first die 20 and they are stair-stepped in the X-direction. The terms "stair-stepped" and "stair-stacked" may be used interchangeably. The stair-step configuration allows respective vertical first-second-third- and subsequent memory-die wires 11, 13, 15 and 17 to have X-direction clearance: the memory first die 12 from the spacer 30, the memory second die 14 from the memory first die 12, etc. Adhesion between memory dice is accomplished by memory-die adhesives 113 for between the memory first die 12 and the memory second die 14, 115 for between the memory second die 14 and the memory third die 16, and 117 for between the memory third die 16 and the memory subsequent die 18. A memory-die subsequent adhesive 119 is depicted, but it is presented optionally depending upon processing conditions.

In an embodiment, the vertical first memory-die wire 11 communicates from the active surface 111 through the molding compound 40 to—and protrudes from the landing surface 141. The processor first die 20 is bumped with a processor bump array, one bump of which is indicted with reference numeral 122. It can be seen the processor bump array 122 and the vertical first memory-die wire 11 communicate through the molding compound 40 at the landing surface 141.

It may now be understood that more than four memory dice may be configured into the stair-stacked memory module 10. In an embodiment, the stair-stacked memory module 10 has five memory dice. In an embodiment, the stair-stacked memory module 10 has six memory dice. In an embodiment, the stair-stacked memory module 10 has seven memory dice. In an embodiment, the stair-stacked memory module 10 has eight memory dice. In an embodiment, the stair-stacked memory module 10 has more than eight—and fewer than or equal to 13 memory dice.

Processing of the PPSSMM 100 including bonding onto the package substrate 50 of the stair-stacked memory module 10 and the processor first die 20, along with the at least one component 60 and 70, can be done by seriatim reflow of each structure according to an embodiment. In an embodiment, all devices are seriatim TCB processed onto the package substrate 50. In an embodiment, the stair-stacked memory module 10 and the processor first die 20 are TCB mated to the package substrate 50, and the at least one component 60 and 70 are reflow-bonded to the package substrate 50. In an embodiment, all structures are simultaneously TCB mated to the package substrate 50.

In an embodiment, reflow chemistry for the bump array 122 is the same qualitatively as for bumps for the at least one component 60 and 70, but a different bump chemistry is used for the bumps that couple the tips of the vertical wires 11, 13, 15 and 17 to the package substrate 50. In FIG. 1, bond pads and bumps are seen at the tips of the vertical wires, where reference lines 11, 13, 15 and 17 cross them to terminate at the vertical wires, but in FIG. 2, the bond pads and bumps are not intersected by the reference lines 11, 13, 15 and 17, but terminate just above the bond pads and bumps for the vertical wires 11, 13, 15 and 17.

In an embodiment where global simultaneous reflow is carried out, bump chemistry is identical across all bond pads on the package substrate 50. In an embodiment where global simultaneous reflow is carried out, bump chemistry is identical for the bump array 122 and bumps for the at least one component 60 and 70, but bump chemistry for the vertical wire bumps is different to accommodate resisting intermetallic formation where the vertical wire bonds 11, 13, 15 and 17 are copper-containing wire. For example, where a given vertical bond wire 11 is copper containing, a tin-lead solder bump is used, but a nickel coating 101 (see FIG. 5D) is formed at the terminal ends of the vertical bond wire. The nickel coating 101 is formed after grinding and etching to expose the terminal ends of the wires through the landing surface 141. In an embodiment, the nickel coating 101 is formed by electroless plating where a nickel monolayer forms on the vertical wire 11 where it emerges at the landing surface 141 of the matrix 40.

In an embodiment, bumps at the bump array 122 have a unique bump chemistry compared to bumps at the terminal ends of the vertical wire bonds 11, 13, 15 and 17, which is also unique to bumps for the at least one component 60 and 70.

FIG. 2 is a cross-section elevation of pre-packaged stair-stacked memory module 200 that is mounted on a redistribution layer 80 along with at least one additional component 60 and 70 according to an embodiment. This PPSSMM 200 is similar to the PPSSMM 100 depicted in FIG. 1 with additional structure of a redistribution layer (RDL) 80 that has been assembled at the landing surface 141 and a land ball grid array 90 is coupled to the RDL 80.

The PPSSMM 200 is configured with the RDL 80 and landside ball-grid array 90 to couple to a board such as a motherboard of a computing system. Adjustment of the vertical height of the spacer 30 may be made by a spacer adjustor 31 such as an adhesive.

In an embodiment, the RDL 80 is fabricated in situ with the stair-stacked memory module 10, the processor first die 20, and the spacer 30 affixed in the matrix 40, along with the at least one component 50 and 70 positioned in a jig (not pictured). The RDL 80 is built up from the wires 11, 13, 15, and 17, the bump array 122, and the at least one component 60 and 70 all being held in useful positions with the jig.

In an embodiment, the RDL 80 has a uniform bond-pad pitch that mates to the vertical bond wires 11, 13, 15 and 17, the bump array 122, and to each of the passive component 60 and the PMIC 70. In an embodiment, the RDL 80 has a bond-pad pitch is uniform for the bump array 122, and to each of the passive component 60 and the PMIC 70, but has a different bond-pad pitch for the vertical bond wires 11, 13, 15 and 17. In an embodiment, the RDL 80 has a bond-pad pitch that is the same for the two components 60 and 70, the bond-pad pitch for the bump array 122 is different, and the bond-pad pitch for the vertical bond wires 11, 13, 15 and 17 is different from all others. In an embodiment, the RDL 80 is configured for a unique bond-pad pitch for each device attached thereto including a different bond-pad pitch for the vertical bond wires 11, 13, 15 and 17 and the bump array 122.

FIG. 3 is a perspective elevation detail of a portion of a stair-stacked memory module 300 according to an embodiment. The stair-stacked memory module 10 shows first-second-third- and fourth memory dice 12, 14, 16 and 18 that are stacked in the Z-direction and are constructed in an X-direction stair-step configuration. The stair-stacked memory module 10 is assembled using an adhesion first film 113 an adhesion second film 115 and an adhesion third film 117.

It can be seen that a series of vertical first memory-die wires 11 are configured serially in the Y-direction on the first memory first die 12 and they extend orthogonally away from the memory first die 12. Similarly, a series of vertical second memory-die wires 13 are configured on the second memory die 14. Likewise, a series of vertical third memory-die wires 15 are configured on the third memory die 16. And similarly, a series of vertical subsequent memory-die wires 17 are configured on the subsequent memory die 18.

FIG. 4A is a top plan 400 of a portion of the prepackaged stair-stacked memory module depicted in FIG. 1 or 2 according to an embodiment. The processor first die 20 and the spacer 30 are exposed and are depicted mounted upon the memory first die 12. In an embodiment, the processor first die 20 is an application-specific integrated circuit (ASIC) that may be selected for a useful PPSSMM product.

FIG. 4B is a top plan 401 of a portion of a prepackaged stair-stacked memory module according to an embodiment. The processor first die 20 and the spacer 30 are exposed and are depicted mounted upon the memory first die 12. In an embodiment, the processor first die 20 is an application-specific integrated circuit (ASIC) such as a memory controller hub (MCH) and a processor second die 21 is a central processing unit (CPU) such as manufactured by Intel Corporation.

FIG. 5A is a cross-section elevation illustrating the assembly 501 of a processor first die 20 to a stair-stacked memory module 10 chip package according to a method embodiment. During processing, a stair-stacked memory module 10 is assembled onto a processor first die 20 and spacer 30 by adhering at the adhesive processor-die film 123. Similar to the stair-stacked memory module 10 depicted in FIG. 1, the stair-stacked memory module 10 includes a subsequent memory die 18 and a subsequent adhesive layer 119 that may be used to stabilize the stack 10 during stack assembly.

It can be seen that respective vertical first-second-third- and subsequent memory-die wires 11, 13, 15 and 17 are anchored at their respective memory dice 12, 14, 16 and 18, but they are also vertically wire-loop anchored to the spacer 30. The spacer 30 is used to stabilize the loop-anchored vertical wires 11, 13, 15 and 17 as well as to stabilize the assembly of the stair-stacked memory module 10 and the first processor die 20 as well as the spacer 30. In an embodiment, the spacer 30 is an aluminum material or some other material that is sufficiently rigid during assembly to provide strengthened loop-anchored wires 11, 13, 15 and 17. The spacer 30 also is seated onto the memory first die 12 alongside the processor first die 20 with an adhesive 32 such as a dielectric material. The adhesive 31 may be configured to release by thermal-release processing, or it may be dissolved after backgrinding of the matrix as will be further illustrated.

FIG. 5B is a cross-section elevation 502 of the stair-stacked memory module chip-scale package 501 depicted in FIG. 5A after further processing according to an embodiment. In an alternative embodiment depicted in FIG. 5B, the adhesive 123 extends to affix both the processor first die 20 and the spacer 30.

A matrix precursor 39 has been formed over the stair-stacked memory module 10 and the processor first die 20 as well as the spacer 30. The loop-anchored vertical wires 11, 13, 15 and 17 are also affixed in the matrix precursor 39, but movement of the vertical portions is resisted by their loop-anchored configuration at the spacer 30. The loop-anchored wires may be variously bent for attachment to the memory dice and the spacer 30 to facilitate few- or no shorting between wires during assembly.

In an embodiment, the matrix precursor 39 is assembled to the various structures. In an embodiment, selected spray depositing of matrix precursor 39 is first done to fill into spaces that may be too tight for useful bulk overmolding conditions, followed by injection molding of more matrix precursor material 39.

FIG. 5C is a cross-section elevation 503 of a PPSSMM after further processing of the structure depicted in FIG. 5B according to an embodiment. Further processing may also be understood by reference to FIGS. 1 and 2. After achieving a structure with the matrix precursor 39 (see FIG. 5B) being cured into the matrix 40, the structures represented in FIGS. 1 and 2 can be achieved by grinding the EMC 40 and eventually approaching exposure of the bump array 122 and the most of the looped portion of the vertical wire precursors is removed to expose the landing surface 141.

Also by grinding to this extent, the formerly loop-anchored wires 11, 13, 15 and 17 depicted in FIG. 5B are reduced in size to approach the vertical wires 11, 13, 15 and 17. Because of useful rigidity of the EMC 40 and as the loop-anchored wires are reduced to vertical wires, the EMC 40 holds the wires in place and resists the vertical portions from deflecting.

In an embodiment as grinding approaches a useful endpoint, removing more EMC 40 is done by chemical etching. The chemical etching may be done by chemical-mechanical polishing (CMP) where etch solvents are selective to leaving metallic materials such as the bump array 122 and the terminal ends of the vertical wires 11, 13, 15 and 17 such that both the bumps of the bump array 122 and the terminal ends of the vertical wires 11, 13, 15 and 17 protrude from the EMC 40 at the landing surface 141. In an embodiment, etching is done alone without mechanical polishing.

In an embodiment, testing of the assembled PPSSMM portion that is contained in the matrix 40 may be done where bumps 122 and vertical wires 11, 13, 15 and 17 are exposed. Since a useful number—and type of bumps 122 and vertical wires 11, 13, 15 and 17 are exposed, testing can be carried out on all of the illustrated devices including the processor first die 20 and the several stacked memory dice 12, 14, 16 and 18. Where more dice are present at the level of the processor first die 20, they also may be tested before further packaging. Testing methods may include placing an individual probe onto a selected bump in the bump array 122, as well as placing an individual probe onto a selected vertical wire from any of the vertical wires 11, 13, 15 and 17 as they are exposed at their terminal ends above the landing surface 141.

After testing is completed and a useful yield has been confirmed, a package substrate 50 (see FIG. 1) or an RDL 80 (see FIG. 2) may be fabricated to couple the processor 20 with the dice in the stair-stacked memory module 10.

FIG. 5D is a detail section taken from the section circle 5D in FIG. 5C according to an embodiment. In an embodiment, the tip of the vertical bond wire 11 is treated such as with a nickel monolayer plating 101 to assist in useful reflow metallurgies. In an example embodiment, the plating 101 is electrolessly plated after the landing surface 141 has been established.

Figure 6:
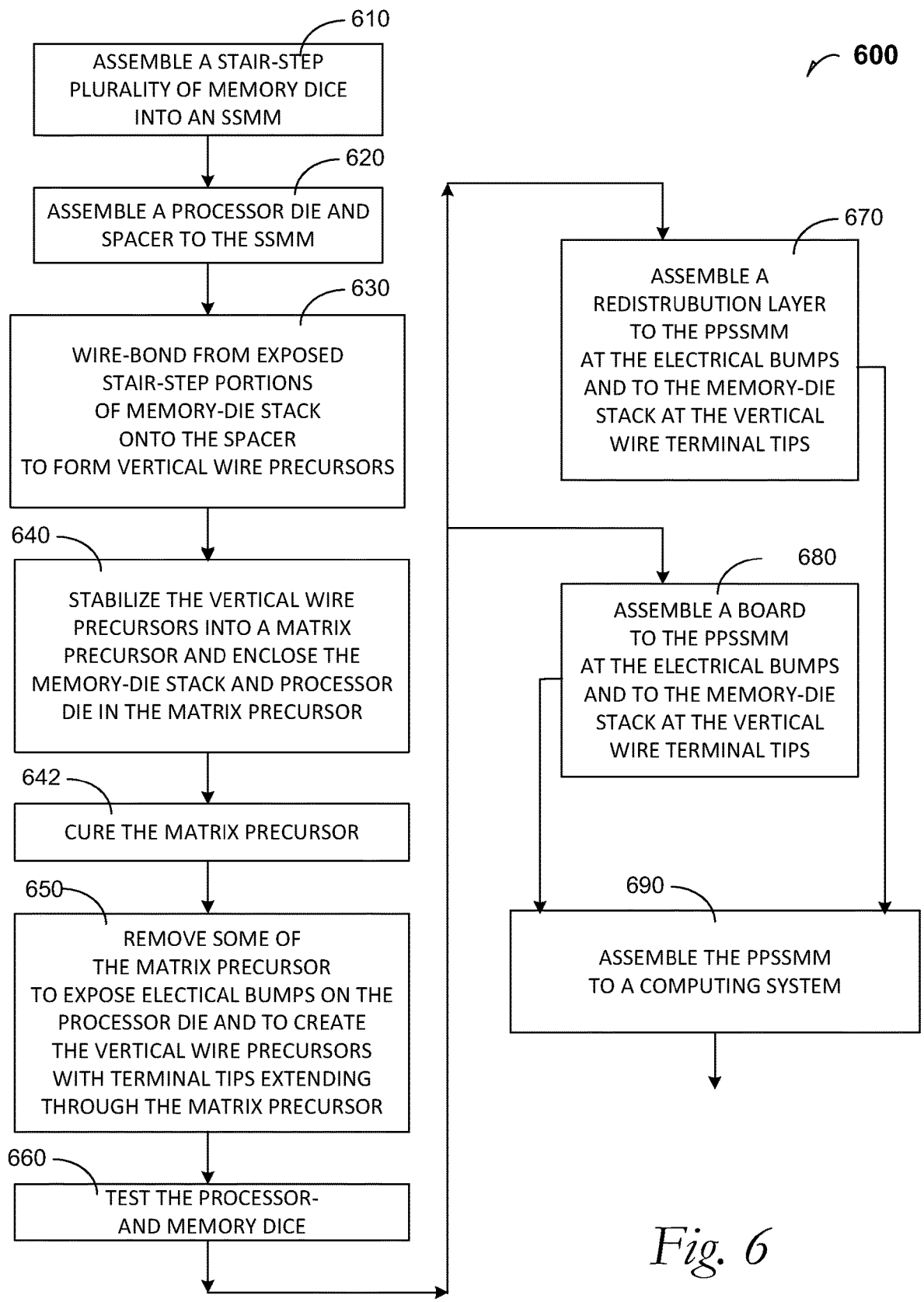
FIG. 6 is a process flow diagram that illustrates a processing embodiment.

FIG. 6 is a process flow diagram 600 that illustrates a processing embodiment.

At 610, the process includes assembling a stair-step plurality of memory dice into a stair-stacked memory module. In a non-limiting example embodiment, the stair-stacked memory module 10 depicted in FIG. 3 (without the vertical wires) is assembled.

At 620, the process includes assembling a processor die and a spacer to an SSMM. In a non-limiting example embodiment, the processor first die 20 and the spacer 30 depicted in FIG. 5A are assembled to the stair-stacked memory module 10 by using a dielectric adhesive 123 (and 32 if present). In a non-limiting example embodiment, pick-and-place technology is used to assemble the processor first die 20 and the spacer 30. In a non-limiting example embodiment, the processor first die 20 is assembled with the spacer 30 as illustrated in FIG. 2, but they are also assembled to a single dielectric adhesive 123.

At 630, the process includes loop-bonding vertical bond wire precursors between respective first-to-subsequent memory dice and onto the spacer. In a non-limiting example embodiment, the looped wirebonding depicted in FIG. 5A is accomplished between the first-through subsequent memory dice 12 through 18 and the spacer 30.

At 640, the process includes stabilizing the vertical wire precursors into a matrix precursor, and enclosing the stair-stacked memory module and the processor die in the matrix precursor. In a non-limiting example embodiment, the matrix precursor 39 is injection molded over the pertinent structures as depicted in FIG. 5B.

At 642, the process includes curing the matrix precursor. In a non-limiting example embodiment, the matrix precursor 39 as depicted in FIG. 5B is thermally cured such as is useful for a dielectric epoxy material. In a non-limiting example embodiment, the matrix precursor 39 is thermal- and light cured where a useful spectrum of light energy cures and cross-links organic materials.

At 650, the process includes removing sufficient of the cured matrix to expose the electrical bumps on the processor first die and to achieve vertical wires in the matrix. In a non-limiting example embodiment, the SSMM 503 as depicted in FIG. 5C has been subjected to at least one of surface grinding and surface etching to expose the bump array 122 and the vertical bond wires 11, 13, 15 and 17 above the landing surface 141.

At 660, a method embodiment includes testing the processor- and memory dice. In a non-limiting example embodiment, testing of the assembled SSMM 503 may be done where bumps 122 and vertical wires 11, 13, 15 and 17 are exposed as illustrated in FIG. 5C.

At 670, the process includes assembling a redistribution layer to the PPSSMM and processor as well as assembling component(s) to an RDL. In a non-limiting example embodiment, the SSMM 503 is assembled to an RDL by reflow solder processing known as controlled-collapse. In a non-limiting example embodiment, the SSMM 503 and at least one component is assembled to an RDL such as by TCB processing. An RDL-assembled PPSSMM 100 is depicted in a non-limiting embodiment at FIG. 1.

At 680 alternatively to process 670, the process includes assembling the PPSSMM as well as the processor to a board and also assembling includes assembling component(s) to the board. In a non-limiting example embodiment, the SSMM 503 is assembled to a board such as a motherboard by reflow solder processing known as controlled-collapse. In a non-limiting example embodiment, the SSMM 503 and at least one component is assembled to a board such as by TCB processing. A board-assembled PPSSMM 200 is depicted in a non-limiting embodiment at FIG. 1.

At 690, the process includes assembling the PPSSMM to a computing system. In a non-limiting example embodiment, the a PPSSMM is assembled to a board such as a motherboard and then to a computing system such as that depicted and described in FIG. 1. In a non-limiting example embodiment, the PPSSMM is assembled to an RDL such as a motherboard and then to a computing system such as that depicted and described in FIG. 2.

Figure 7:
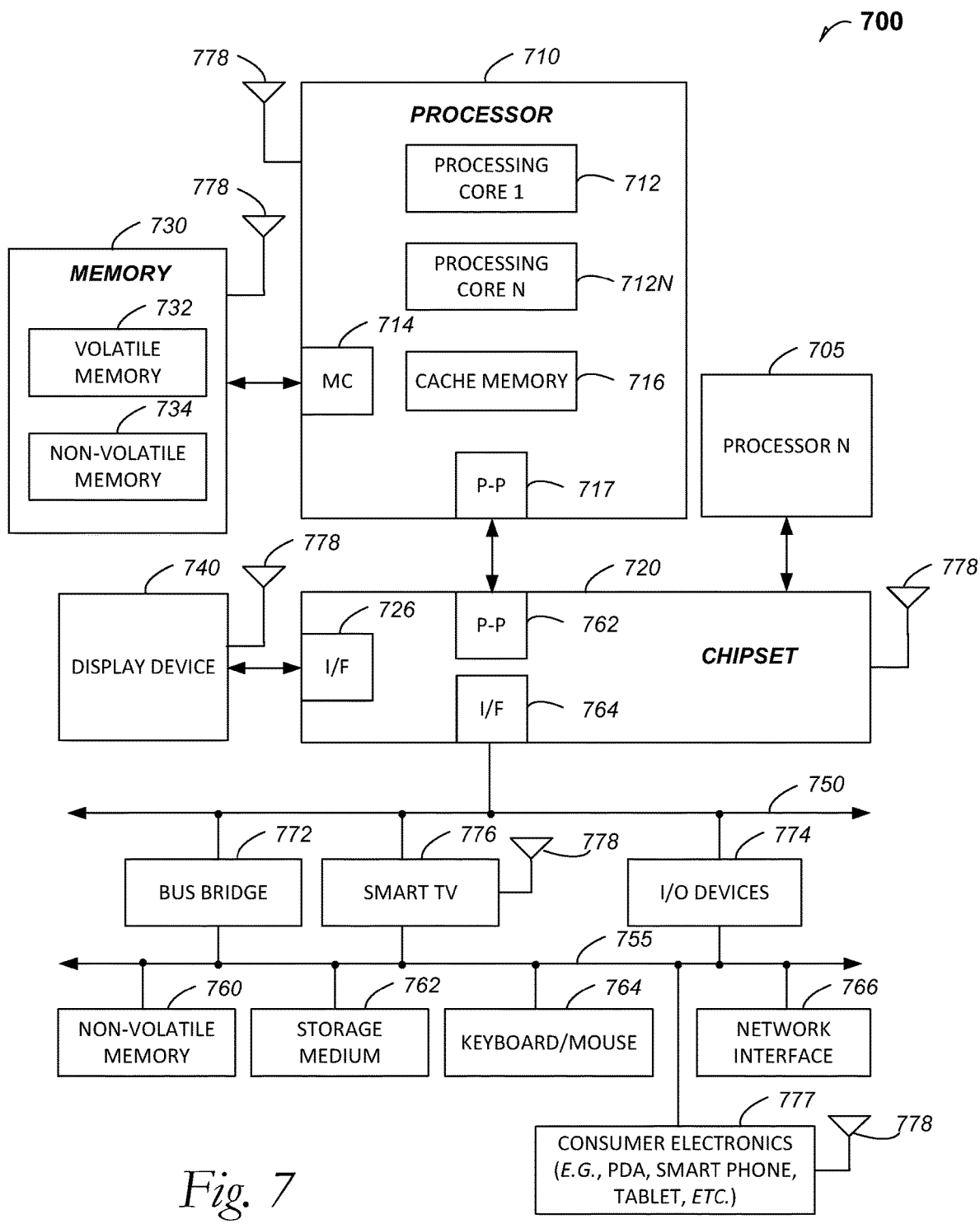
FIG. 7 is included to show an example of a higher level device application for the pre-packaged stair-stacked memory module with board-mounted components according to several embodiments.

FIG. 7 is a computing system 700 according to an embodiment. FIG. 7 illustrates a system level diagram, according to one embodiment of the invention. For instance, FIG. 7 depicts an example of a microelectronic device that includes a PPSSMM embodiment on a substrate such as a board- or RDL-mounted PPSSMM as described in the present disclosure.

FIG. 7 is included to show an example of a higher level device application for the PPSSMM embodiments. In one embodiment, a system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, the PPSSMM is part of a computing system 700.

In an embodiment, the processor 710 has one or more processing cores 712 and 712N, where 712N represents the Nth processor core inside processor 710 where N is a positive integer. In an embodiment, the electronic device system 700 using an PPSSMM includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the PPSSMM-containing computing system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device. In an embodiment the PPSSMM is a principal source of non-volatile memory function for the computing system 700.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a semiconductive bridge as set forth in this disclosure. The chipset 720 enables the processor 710 to connect to other elements in the SiP device system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In and embodiment, the processor 710 and the chipset 720 are merged into a single SOC such as selected stair-stacked memory module SiP embodiments described herein. Additionally, the chipset 720 connects to one or more buses 750 and 755 that interconnect various elements 774, 760, 762, 764, and 766. Buses 750 and 755 may be interconnected together via a bus bridge 772. In an embodiment, the chipset 720 couples with a non-volatile memory 760, a mass storage device(s) 662, a keyboard/mouse 664, and a network interface 766 by way of at least one of the interface 724 and 704, the smart TV 776, and the consumer electronics 777, etc.

In and embodiment, the mass storage device 762 includes, but is not limited to, a solid state drive, a hard disk drive, a universal serial bus flash memory drive, or any other form of computer data storage medium. In an embodiment, an PPSSMM is the principal mass-storage device 762. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the PPSSMM-containing computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

In an embodiment, either the RDL 50 depicted in FIG. 1 or a substrate bonded to the land ball grid array 90 depicted in FIG. 2, is the outer shell for a hand-held computing system. In an embodiment, the outer shell may be part of a computing system that can be hand held.

EXAMPLES

Example 1 is a pre-packaged, stair-stepped memory module comprising: a matrix including a landing surface; a plurality of memory dice stacked in a stair-step relationship and seated in the matrix, the plurality of memory dice, including a memory first die and a memory subsequent die, the memory first die including an active surface and a backside surface and the memory subsequent die including an active surface and a backside surface, wherein the memory first die includes a vertical first bond wire that extends from the memory first die active surface and breaches the matrix landing surface, and the memory subsequent die includes a vertical subsequent bond wire that extends from the memory subsequent die active surface and breaches the matrix landing surface; a processor first die disposed on the memory first die and at least partially seated in the matrix, the processor first die including an active surface and a backside surface, wherein a processor bump array is disposed on the processor first die active surface, and wherein the processor bump array extends at least partially away from the matrix landing surface; a spacer disposed on the memory first die, and wherein the spacer is disposed between the processor first die and the memory first die vertical bond wire; wherein the plurality of memory dice, the processor first die, and the spacer are disposed in the matrix and are contained as a stair-stacked memory module; a package substrate upon which the stair-stacked memory module is mounted; and at least one component mounted on the package substrate.

In Example 2, the subject matter of Example 1 optionally includes wherein the at least one component includes at least one passive device selected from the group consisting of a balun, a resistor, an inductor, and a capacitor.

In Example 3, the subject matter of any one or more of Examples 1-2 optionally include wherein the at least one component includes a power-management integrated circuit (PMIC).

In Example 4, the subject matter of any one or more of Examples 1-3 optionally include wherein the at least one component includes: at least one passive device selected from the group consisting of a balun, a resistor, an inductor, and a capacitor; and a power-management integrated circuit (PMIC).

In Example 5, the subject matter of any one or more of Examples 1-4 optionally include wherein the package substrate is a redistribution layer (RDL) that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch.

In Example 6, the subject matter of Example 5 optionally includes wherein the package substrate is a redistribution layer (RDL) that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, wherein a passive component is also disposed on the package substrate, and wherein the passive component is mated at passive component bond-pad pitch that is quantitatively different from each of the first- and second bond-pad pitches.

In Example 7, the subject matter of any one or more of Examples 5-6 optionally include wherein the package substrate is a redistribution layer (RDL) that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, further including: a passive component is the at least one component, wherein the passive component is disposed on the package substrate, and wherein the passive component is mated at a passive component third bond-pad pitch that is quantitatively different from each of the first- and second bond-pad pitches; and a power-management integrated circuit (PMIC) is another at least one component disposed on the package substrate, and wherein the PMIC is mated at a PMIC fourth bond-pad pitch that is quantitatively different from each of the first-second- and third bond-pad pitches.

In Example 8, the subject matter of any one or more of Examples 5-7 optionally include wherein the package substrate is a redistribution layer (RDL) that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, further including: a passive component is the at least one component, wherein the passive component is disposed on the package substrate, and wherein the passive component is mated at a passive component third bond-pad pitch that is quantitatively different from each of the first- and second bond-pad pitches; and a power-management integrated circuit (PMIC) is another at least one component disposed on the package substrate, and wherein the PMIC is mated at a PMIC fourth bond-pad pitch that is quantitatively different from each of the first-second bond-pad pitches, but the third- and fourth bond-pad pitches are quantitatively equal.

In Example 9, the subject matter of any one or more of Examples 1-8 optionally include wherein the package substrate is a board that has a bump array first bond-pad pitch to match the processor bump array, and a vertical bond-wire second bond-pad pitch to match the vertical bond wires, wherein the first bond-pad pitch is quantitatively different from the second bond-pad pitch.

In Example 10, the subject matter of Example 9 optionally includes wherein the package substrate is a board that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, wherein a passive component is also disposed on the package substrate, and wherein the passive component is mated at passive component bond-pad pitch that is quantitatively different from each of the first- and second bond-pad pitches.

In Example 11, the subject matter of any one or more of Examples 9-10 optionally include wherein the package substrate is a board that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, further including: a passive component is the at least one component, wherein the passive component is disposed on the package substrate, and wherein the passive component is mated at a passive component third bond-pad pitch that is quantitatively different from each of the first- and second bond-pad pitches; and a power-management integrated circuit (PMIC) is another at least one component disposed on the package substrate, and wherein the PMIC is mated at a PMIC fourth bond-pad pitch that is quantitatively different from each of the first-second- and third bond-pad pitches.

In Example 12, the subject matter of any one or more of Examples 9-11 optionally include wherein the package substrate is a board that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, further including: a passive component is the at least one component, wherein the passive component is disposed on the package substrate, and wherein the passive component is mated at a passive component third bond-pad pitch that is quantitatively different from each of the first- and second bond-pad pitches; and a power-management integrated circuit (PMIC) is another at least one component disposed on the package substrate, and wherein the PMIC is mated at a PMIC fourth bond-pad pitch that is quantitatively different from each of the first-second bond-pad pitches, but the third- and fourth bond-pad pitches are quantitatively equal.

In Example 13, the subject matter of any one or more of Examples 1-12 optionally include wherein each vertical bond wire is coupled to the package substrate with a bump chemistry that resists intermetallic formation between copper in the vertical bond wire and the bump.

In Example 14, the subject matter of any one or more of Examples 1-13 optionally include wherein each vertical bond wire is coupled to the package substrate with a bump chemistry that resists intermetallic formation between copper in the vertical bond wire and the bump, and wherein the vertical bond wire contains copper and includes a nickel coating and wherein the vertical bond wire is coupled to a solder bump.

In Example 15, the subject matter of any one or more of Examples 1-14 optionally include wherein each vertical bond wire is coupled to the package substrate with a bump chemistry that resists intermetallic formation between copper in the vertical bond wire and the bump, and wherein the vertical bond wire contains copper and includes a nickel coating and wherein the vertical bond wire is coupled to a lead-tin solder bump.

Example 16 is a method of testing a pre-packaged stair-stacked memory module, comprising: applying a test probe to a bump in a bump array of a processor first die that is seated in a matrix, the matrix including a landing surface, and the matrix also containing a stair-stacked memory module including a memory first die and a memory subsequent die; applying a test probe to a first vertical bond wire terminal end that extends from the memory first die at the landing surface; applying a test probe to a subsequent vertical bond wire terminal end that extends from the memory subsequent die at the landing surface; wherein the memory first die includes an active surface and a backside surface and the memory subsequent die including an active surface and a backside surface, wherein the memory first die includes the vertical first bond wire that extends from the memory first die active surface, and the memory subsequent die includes the subsequent vertical bond wire that extends from the memory subsequent die active surface and breaches the matrix landing surface.

In Example 17, the subject matter of Example 16 optionally includes obtaining a test result for each die in the stair-stacked memory module.

In Example 18, the subject matter of Example 17 optionally includes after obtaining the test result, assembling the stair-stacked memory module to at least one component on a board.

Example 19 is a method of assembling a pre-packaged stair-stacked memory module, comprising: assembling a stair-stacked memory module to a processor die and a spacer, wherein the processor die and spacer are disposed on an active surface of a memory first die; wirebonding vertical bond wire precursors between each memory die in the stair-stacked memory module from each respective active surface to the spacer; seating the stair-stacked memory module, the vertical bond wire precursors, the processor die and the spacer in a matrix precursor; curing the matrix precursor to achieve a matrix; removing a portion of the matrix to expose a bump array on the processor die and to achieve vertical bond wires extending from the matrix at a landing surface; assembling the stair-stacked memory module, the processor die and the spacer to a package substrate; and assembling at least one component to the package substrate, wherein the at least one component is selected from the group consisting of a balun, a resistor, a capacitor, an inductor and a power-management integrated circuit (PMIC).

In Example 20, the subject matter of Example 19 optionally includes wherein devices in the matrix, a passive device, and PMIC are seriatim assembled to the package substrate.

In Example 21, the subject matter of any one or more of Examples 19-20 optionally include wherein devices in the matrix, a passive device, and PMIC are simultaneously assembled to the package substrate by thermal compression bonding.

In Example 22, the subject matter of any one or more of Examples 19-21 optionally include wherein devices in the matrix, a passive device, and PMIC are simultaneously assembled to the package substrate by solder bump reflow.

Example 23 is a computing system including a pre-packaged stair-stacked memory module comprising: a matrix including a landing surface; a plurality of memory dice stacked in a stair-step relationship and seated in the matrix, the plurality of memory dice, including a memory first die and a memory subsequent die, the memory first die including an active surface and a backside surface and the memory subsequent die including an active surface and a backside surface, wherein the memory first die includes a vertical first bond wire that extends from the memory first die active surface and breaches the matrix landing surface, and the memory subsequent die includes a vertical subsequent bond wire that extends from the memory subsequent die active surface and breaches the matrix landing surface; a processor first die disposed on the memory first die and at least partially seated in the matrix, the processor first die including an active surface and a backside surface, wherein a processor bump array is disposed on the processor first die active surface, and wherein the processor bump array extends at least partially away from the matrix landing surface; a spacer disposed on the memory first die, and wherein the spacer is disposed between the processor first die and the memory first die vertical bond wire; wherein the plurality of memory dice, the processor first die, and the spacer are disposed in the matrix and are contained as a stair-stacked memory module; a package substrate upon which the stair-stacked memory module is mounted; and at least one component mounted on the package substrate, and wherein the package substrate is configured as an outer shell for a computing device.

In Example 24, the subject matter of Example 23 optionally includes wherein the outer shell is configured as a hand-held device outer shell.

In Example 25, the subject matter of any one or more of Examples 23-24 optionally include wherein the processor die is a processor first die with memory-controller hub (MCH) capabilities, and further including a processor second die that includes central processing unit capabilities.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A pre-packaged, stair-stacked memory module comprising:
    a matrix including a landing surface;
    a plurality of memory dice stacked in a stair-step relationship and seated in the matrix, the plurality of memory dice, including a memory first die and a memory subsequent die, the memory first die including an active surface and a backside surface and the memory, subsequent die including an active surface and a backside surface, wherein the memory first die includes a vertical first bond wire that extends from the memory first die active surface and breaches the matrix landing surface, and the memory subsequent die includes a vertical subsequent bond wire that extends from the memory subsequent die active surface and breaches the matrix landing surface;
    a processor first die disposed on the memory first die and at least partially seated in the matrix, the processor first die including an active surface and a backside surface, wherein a processor bump array is disposed on the processor first die active surface, and wherein the processor bump array extends at least partially away from the matrix landing surface;
    a spacer disposed on the memory first die, and wherein the spacer is disposed between the processor first die and the memory first die vertical bond wire;
    wherein the plurality of memory dice, the processor first die, and the spacer are disposed in the matrix and are contained as a stair-stacked memory module;
    a package substrate upon which the stair-stacked memory module is mounted; and
    at least one component mounted on the package substrate.

2. The pre-packaged stair-stacked memory module of claim 1, wherein the at least one component includes at least one passive device selected from the group consisting of a balun, a resistor, an inductor, and a capacitor.

3. The pre-packaged stair-stacked memory module of claim 1, wherein the at least one component includes a power-management integrated circuit (PMIC).

4. The pre-packaged stair-stacked memory module of claim 1, wherein the at least one component includes:
    at least one passive device selected from the group consisting of a balun, a resistor, an inductor and a capacitor; and
    a power-management integrated circuit (PMIC).

5. The pre-packaged stair-stacked memory module of claim 1, wherein package substrate is a redistribution layer (RDL) that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch.

6. The pre-packaged stair-stacked memory module of claim 5, wherein package substrate is a redistribution layer (RDL) that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, wherein a passive component is also disposed on the package substrate, and wherein the passive component is mated at passive component bond-pad pitch that is quantitatively different from each of the first- and second bond-pad pitches.

7. The pre-packaged stair-stacked memory module of claim 5, wherein package substrate is a redistribution layer (RDL) that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, further including:
    a passive component is the at least one component, wherein the passive component is disposed on the package substrate, and wherein the passive component is mated at a passive component third bond-pad pitch that is quantitatively different from each of the first- and second bond-pad pitches; and
    a power-management integrated circuit (PMIC) is another at least one component disposed on the package substrate, and wherein the PMIC is mated at a PMIC fourth bond-pad pitch that is quantitatively different from each of the first-second- and third bond-pad pitches.

8. The pre-packaged stair-stacked memory module of claim 5, wherein package substrate is a redistribution layer (RDL) that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, further including:
- a passive component is the at least one component, wherein the passive component is disposed on the package substrate, and wherein the passive component is mated at a passive component third bond-pad pitch that is quantitatively different from each of the first- and second bond-pad pitches; and
- a power-management integrated circuit (PMIC) is another at least one component disposed on the package substrate, and wherein the PMIC is mated at a PMIC fourth bond-pad pitch that is quantitatively different from each of the first-second bond-pad pitches, but the third- and fourth bond-pad pitches are quantitatively equal.

9. The pre-packaged stair-stacked memory module of claim 1, wherein package substrate is a board that has a bump array first bond-pad pitch to match the processor bump array, and a vertical bond-wire second bond-pad pitch to match the vertical bond wires, wherein the first bond-pad pitch is quantitatively different from the second bond-pad pitch.

10. The pre-packaged stair-stacked memory module of claim 9, wherein package substrate is a board that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, wherein a passive component is also disposed on the package substrate, and wherein the passive component is mated at passive component bond-pad pitch that is quantitatively different from each of the first- and second bond-pad pitches.

11. The pre-packaged stair-stacked memory module of claim 9, wherein package substrate is a board that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, further including:
- a passive component is the at least one component, wherein the passive component is disposed on the package substrate, and wherein the passive component is mated at a passive component third bond-pad pitch that is quantitatively different from each of the first- and second bond-pad pitches; and
- a power-management integrated circuit (PMIC) is another at least one component disposed on the package substrate, and wherein the PMIC is mated at a PMIC fourth bond-pad pitch that is quantitatively different from each of the first-second- and third bond-pad pitches.

12. The pre-packaged stair-stacked memory module of claim 9, wherein package substrate is a board that has a bump array first bond-pad pitch to match the processor bump array, and a vertical bond-wire second bond-pad pitch to match the vertical first- and subsequent bond wires, wherein the first bond-pad pitch is quantitatively different from the second bond-pad pitch, further including:
- a passive component is the at least one component, wherein the passive component is disposed on the package substrate, and wherein the passive component is mated at a passive component third bond-pad pitch that is quantitatively different from each of the first- and second bond-pad pitches; and
- a power-management integrated circuit (PMIC) is another at least one component disposed on the package substrate, and wherein the PMIC is mated at a PMIC fourth bond-pad pitch that is quantitatively different from each of the first-second bond-pad pitches, but the third- and fourth bond-pad pitches are quantitatively equal.

13. The pre-packaged, stair-stacked memory module of claim 1, wherein each vertical bond wire is coupled to the package substrate with a bump chemistry that resists intermetallic formation between copper in the vertical bond wire and the bump.

14. The pre-packaged, stair-stacked memory module of claim 1, wherein each vertical bond wire is coupled to the package substrate with a bump chemistry that resists intermetallic formation between copper in the vertical bond wire and the bump, and wherein the vertical bond wire contains copper and includes a nickel coating and wherein the vertical bond wire is coupled to a solder bump.

15. The pre-packaged, stair-stacked memory module of claim 1, wherein each vertical bond wire is coupled to the package substrate with a bump chemistry that resists intermetallic formation between copper in the vertical bond wire and the bump, and wherein the vertical bond wire contains copper and includes a nickel coating and wherein the vertical bond wire is coupled to a lead-tin solder bump.

16. A method of testing a pre-packaged; stair-stacked memory module, comprising:
- applying a test probe to a bump in a bump array of a processor first die that is seated in a matrix, the matrix including a landing surface, and the matrix also containing a stair-stacked memory module including a memory first die and a memory subsequent die;
- applying a test probe to a first vertical bond wire terminal end that extends from the memory first die at the landing surface;
- applying a test probe to a subsequent vertical bond wire terminal end that extends from the memory subsequent die at the landing surface;
- wherein the memory first die includes an active surface and a backside surface and the memory subsequent die including an active surface and a backside surface, wherein the memory first die includes the vertical first bond wire that extends from the memory first die active surface, and the memory subsequent die includes the subsequent vertical bond wire that extends from the memory subsequent die active surface and breaches the matrix landing surface.

17. The method of claim 16; further including:
obtaining a test result for each die in the stair-stacked memory module.

18. The method of claim 17, further including after obtaining the test result, assembling the stair-stacked memory module to at least one component on a board.

19. A method of assembling a pre-packaged, stair-stacked memory module, comprising:
- assembling a stair-stacked memory module to a processor die and a spacer, wherein the processor die and spacer are disposed on an active surface of a memory first die;
- wirebonding vertical bond wire precursors between each memory die in the stair-stacked memory module from each respective active surface to the spacer;
- seating the stair-stacked memory module, the vertical bond wire precursors, the processor die and the spacer in a matrix precursor;
- curing the matrix precursor to achieve a matrix;

removing a portion of the matrix to expose a bump array on the processor die and to achieve vertical bond wires extending from the matrix at a landing surface;

assembling the stair-stacked memory module, the processor die and the spacer to a package substrate; and assembling at least one component to the package substrate, wherein the at least one component is selected from the group consisting of a balun, a resistor, a capacitor, an inductor and a power-management integrated circuit (PMIC).

20. The method of claim 19, wherein devices in the matrix, a passive device, and PMIC are seriatim assembled to the package substrate.

21. The method of claim 19, wherein devices in the matrix, a passive device, and PMIC are simultaneously assembled to the package substrate by thermal compression bonding.

22. The method of claim 19, wherein devices in the matrix, a passive device, and PMIC are simultaneously assembled to the package substrate by solder bump reflow.

23. A computing system including a pre-packaged, stair-stacked memory module comprising:

a matrix including a landing surface;

a plurality of memory dice stacked in a stair-step relationship and seated in the matrix, the plurality of memory dice, including a memory first die and a memory subsequent die, the memory first die including an active surface and a backside surface and the memory subsequent die including an active surface and a backside surface, wherein the memory first die includes a vertical first bond wire that extends from the memory first die active surface and breaches the matrix landing surface, and the memory subsequent die includes a vertical subsequent bond wire that extends from the memory subsequent die active surface and breaches the matrix landing surface;

a processor first die disposed on the memory first die and at least partially seated in the matrix, the processor first die including an active surface and a backside surface, wherein a processor bump array is disposed on the processor first die active surface, and wherein the processor bump array extends at least partially away from the matrix landing surface;

a spacer disposed on the memory first die, and wherein the spacer is disposed between the processor first die and the memory first die vertical bond wire;

wherein the plurality of memory dice, the processor first die, and the spacer are disposed in the matrix and are contained as a stair-stacked memory module;

a package substrate upon which the stair-stacked memory module is mounted; and at least one component mounted on the package substrate, and wherein the package substrate is configured as an outer shell for a computing device.

24. The computing system of claim 23, wherein the outer shell is configured as a hand-held device outer shell.

25. The computing system of claim 23, wherein the processor die is a processor first die with memory-controller hub (MCH) capabilities, and further including a processor second die that includes central processing unit capabilities.

* * * * *